(12) United States Patent
Nakata et al.

(10) Patent No.: US 6,518,779 B1
(45) Date of Patent: Feb. 11, 2003

(54) PROBE CARD

(75) Inventors: Yoshiro Nakata, Kyoto; Shinichi Oki, Osaka; Masaaki Ishizaka, Kanagawa, all of (JP)

(73) Assignee: Matsushita Electrical Industrial Do., Ltd., Osaka (JP)

( * ) Notice: Subject to any disclaimer, the term of this patent is extended or adjusted under 35 U.S.C. 154(b) by 0 days.

(21) Appl. No.: 09/174,536

(22) Filed: Oct. 19, 1998

(30) Foreign Application Priority Data

Oct. 20, 1997 (JP) .............................. 9-286415

(51) Int. Cl.⁷ .............................................. G01R 31/02
(52) U.S. Cl. ........................................ 324/754; 324/765
(58) Field of Search ................................. 324/754, 755, 324/761, 765; 439/482; 438/14, 17, 18

(56) References Cited

U.S. PATENT DOCUMENTS

| | | | | |
|---|---|---|---|---|
| 4,780,670 A | * | 10/1988 | Cherry | 324/754 |
| 5,070,297 A | * | 12/1991 | Kwon et al. | 324/754 |
| 5,148,103 A | * | 9/1992 | Pasiecznik, Jr. | 324/754 |
| 5,917,330 A | * | 6/1999 | Miley | 324/754 |
| 6,005,401 A | | 12/1999 | Nakata et al. | |

FOREIGN PATENT DOCUMENTS

| | | |
|---|---|---|
| JP | 7-111280 | 4/1995 |
| JP | 7-153298 | 6/1995 |
| JP | 8-340030 | 12/1996 |
| JP | 9-252031 | 9/1997 |
| JP | 63-146770 | 9/1998 |

OTHER PUBLICATIONS

Y. Nakata et al., "A Wafer–Level Burn–in Technology Using the Contractor Controlled Thermal Expansion", Proc. of 1997 International Conference and Exhibition on Multichip Models, pp. 259–264, 6 sheets, Apr., 1997.

* cited by examiner

*Primary Examiner*—Vinh P. Nguyen
(74) *Attorney, Agent, or Firm*—Nixon Peabody LLP; Donald R. Studebaker

(57) ABSTRACT

A probe card is used in testing an electric characteristic of plural semiconductor chips formed on a semiconductor wafer in a batch at a wafer level through application of a voltage to electrodes of the semiconductor chips. The probe card includes a card body, plural probe terminals, a wiring and a control element. The plural probe terminals are disposed on one surface of the card body in positions corresponding to the electrodes of the semiconductor chips. The wiring is disposed on the other surface of the card body and electrically connected with the probe terminals. The control element is disposed on the latter surface of the card body between the wiring and the probe terminals and controls input/output of the semiconductor chips.

7 Claims, 6 Drawing Sheets

# PROBE CARD

BACKGROUND OF THE INVENTION

The present invention relates to a probe card for use in simultaneously testing, at a wafer level, plural integrated circuits of chips formed on a semiconductor wafer.

In accordance with recent remarkable development in decrease in size and price of electric equipment mounting semiconductor integrated circuit devices, there are increasing demands for further decrease in size and price of the semiconductor integrated circuit devices.

In general, a semiconductor integrated circuit device is supplied with a semiconductor chip and lead frames electrically connected through bonding wires and the semiconductor chip sealed with a resin or ceramic, so as to be mounted on a printed substrate.

Now, a conventional burn-in apparatus used for a burn-in test of resin sealed semiconductor chips will be described with reference to an accompanying drawing.

FIG. 5 is a schematic diagram for showing the structure of the conventional burn-in apparatus. The burn-in apparatus 100 of FIG. 5 includes a burn-in chamber 101 and a pattern generator (PG) 121 for generating a test signal to be input to an integrated circuit on a semiconductor chip.

Within the burn-in chamber 101, plural burn-in (BI) boards 102 are held and connected with connectors 103. Herein, merely two BI boards 102 are shown, but more BI boards are contained in the burn-in chamber 101 with a vertical interval therebetween. On each of the BI boards 102, a large number of resin sealed semiconductor chips 104 are placed in an input enable state.

At the outside of the burn-in chamber 101 between a signal line 122 connected with the PG 121 and the BI boards 102, driver boards 123 respectively corresponding to the BI boards 102 are held and connected with outer portions of the connectors 103.

On each of the driver boards 123, plural active devices 124, such as a driver for driving a test signal from the PG 121 and a comparator for comparing an expected value signal to each semiconductor chip 104 on the BI boards 102 and an output signal thereof and outputting a signal obtained through the comparison to the PG 121, are placed.

On the other hand, as is described in U.S. patent application Ser. No. 08/358,609 and "A Wafer-Level Burn-in Technology Using the Contactor Controlled Thermal Expansion" (Y. Nakata et al., Proceedings 1997, International Conference and Exhibition on Multichip Models, pp. 259–264, April 1997), a probe card for simultaneously conducting the burn-in on semiconductor chips at the wafer level in a batch has been proposed.

FIG. 6 is a sectional view of the proposed probe card for batch burn-in (hereinafter referred to as the wafer burn-in). As is shown in FIG. 6, the probe card 201 is made from glass or the like, and includes a card body 201a provided with a wiring layer on a main surface (corresponding to the lower surface in FIG. 6), and a film 201b having bumps made from a polyimide thin film with its edge supported by a rigid ring 202 of ceramic or the like. On the main surface of the film 201b having bumps, plural bumps 204 serving as probe terminals are formed in positions corresponding to respective testing electrodes of the semiconductor chips on a semiconductor wafer 203. These bumps 204 are electrically connected with the card body 201a through contacts penetrating the film 201b having the bumps.

In the wafer burn-in using this probe card 201, it is necessary to bring the respective bumps 204 of the probe card 201 to complete contact with the respective electrodes of the semiconductor chips formed on the semiconductor wafer 203. For this purpose, a wafer tray 211 of a metal such as aluminum is used for holding the semiconductor wafer 203.

In the periphery of a surface of the wafer tray 211 opposing the main surface of the probe card 201 (i.e., in the periphery of the main surface of the wafer tray 211), a sealing ring 212 of silicon rubber or the like is provided so as to form a sealed space together with the main surface of the probe card 201 and the main surface of the wafer tray 211. Also, the wafer tray 211 is provided, at a side portion, with a vacuum valve 213 for communicating the sealed space with the outside and for retaining a reduced pressure in the sealed space.

When the pressure within the sealed space is reduced by releasing the air through the vacuum valve 213, the back surface of the probe card 201 and the back surface of the wafer tray 211 are pressed against each other due to the atmospheric pressure. Accordingly, the bumps 204 formed on the main surface of the film 201b having the bumps of the probe card 201 come closer to and are pressed against the electrodes formed on the semiconductor wafer 203. As a result, when the probe card 201, the semiconductor wafer 203 and the wafer tray 211 are thus integrated with one another and placed in a burn-in apparatus, the wafer burn-in can be performed.

In the burn-in apparatus 100 used for resin sealed semiconductor chips, the burn-in test of the semiconductor chips 104 is conducted at a high temperature of approximately 125° C. within the burn-in chamber 101. Accordingly, it is necessary to put the semiconductor chips 104 placed on the BI boards 102 into the burn-in chamber 101 retained at a high temperature. On the other hand, the active devices 124 on the driver boards 123 are required to be placed at the outside of the burn-in chamber 101 in order to secure the operation of the active devices 124. As a result, the length of the signal line 122 is elongated, and hence, the signal can be easily degraded and the apparatus is not suitable to a high speed operation test.

Furthermore, in the burn-in apparatus used in the wafer burn-in, more semiconductor chips are tested in a batch than those in the above-mentioned burn-in apparatus used for resin sealed semiconductor chips. Therefore, a load on the circuit testing apparatus is disadvantageously largely increased as compared with a conventional technique where each chip is tested.

SUMMARY OF THE INVENTION

The object of the invention is preventing the degradation of a test signal and decreasing a test load on a circuit testing apparatus.

The present inventors have found the following: In the probe card 201 of FIG. 6 used for the wafer burn-in, a large number of semiconductor chips 104 formed on the semiconductor wafer 203 themselves generate heat during the operation. Therefore, in order to retain the semiconductor wafer 203 at a predetermined temperature, it is necessary to locally control (through a heating or endothermic operation) the temperature of merely the wafer tray 211 in contact with the semiconductor wafer 203. Moreover, in the case where the temperature is thus controlled, the temperature of the back surface of the probe card 201 can be controlled to be lower than approximately 70° C. by appropriately controlling the ambient temperature of the probe card 201 when plural wafer trays 211 are placed in a burn-in apparatus.

In addition to the above-described findings, the present inventors have noticed that a space, which cannot be found on the conventional BI board 102, is present on the back surface of the probe card 201 receiving the atmospheric pressure. Based on these findings and fact, the present invention has been achieved.

According to the present invention, on the back surface of a probe card (i.e., a surface other than the surface opposing the semiconductor wafer) for use in the wafer burn-in, a device for controlling or testing a semiconductor chip or a device for suppressing variation of a control signal is formed correspondingly to each chip.

Specifically, the probe card of this invention, for use in testing an electric characteristic of plural semiconductor chips formed on a semiconductor wafer in a batch at a wafer level through application of a voltage to electrodes of the plural semiconductor chips, comprises a card body; plural probe terminals disposed on a first surface of the card body in positions respectively corresponding to the electrodes of the semiconductor chips; a wiring disposed on a second surface of the card body and electrically connected with the probe terminals; and control means disposed on the second surface of the card body between the wiring and the probe terminals for controlling input/output of the semiconductor chips.

In the probe card of this invention, when a driver circuit or a testing function circuit is used as the control means, signal degradation can be avoided because the length of a wiring between the driver circuit or the testing function circuit and the semiconductor chip can be very small. As a result, a high speed operation test can be performed on the semiconductor chips. In addition, the load on the circuit testing apparatus can be dispersed by effectively using the back surface of the card body with a spare space.

Preferably, the wiring is a voltage supply line for supplying a voltage to the probe terminals via through holes formed in the card body, and the control means includes a driver circuit device. In this manner, the quality of a control signal output from the driver circuit device disposed in the vicinity of the semiconductor chip to be tested can be prevented from being degraded, and hence, a desired test can be definitely conducted.

Preferably, the wiring is a voltage supply line for supplying a voltage to the probe terminals via through holes formed in the card body, and the control means includes a testing function circuit device. In this manner, the quality of a test signal and a control signal output from the testing function circuit device disposed in the vicinity of the semiconductor chip to be tested can be prevented from being degraded, and hence, a desired test can be definitely conducted.

Preferably, the wiring is a voltage supply line for supplying a voltage to the probe terminals via through holes formed in the card body, and the control means includes a frequency multiplying circuit device. In this manner, a high frequency signal with a frequency higher than that of a high frequency signal output from a circuit testing apparatus can be generated. In addition, since the frequency multiplying device is disposed in the vicinity of the probe terminal, the quality of the high frequency signal generated by the frequency multiplying device can be prevented from being degraded. As a result, the circuit testing apparatus can be easily improved in its performance and attain high-speed test.

Preferably, the wiring is a data output line for receiving output from the probe terminals via through holes formed in the card body, and the control means includes a signal compressing circuit device. In this manner, in the case where an output signal is output with multibit, the bit number of the output signal can be decreased. Therefore, the output data can be simplified, resulting in improving the test efficiency.

Preferably, the control means includes a capacitance device disposed in parallel to the wiring. In this manner, even when a supply voltage to be applied to the wiring is transiently varied, such transient voltage variation can be definitely suppressed in the vicinity of the probe terminal. Accordingly, a desired test can be definitely conducted on semiconductor chips at the wafer level.

Preferably, the wiring is a voltage supply line for supplying a voltage to the probe terminals via through holes formed in the card body, and the control means includes a current limiting device. In this manner, when an abnormally large current flows because of a defect inherent to or caused during the batch test in any of the plural semiconductor chips, no voltage is applied to the defective semiconductor chip owing to the current limiting device corresponding to the defective semiconductor chip. Accordingly, a supply voltage line and a ground voltage line can be prevented from being short-circuited through the defective semiconductor chip. As a result, the remaining semiconductor chips can be satisfactorily tested.

BRIEF DESCRIPTION OF THE DRAWINGS

FIG. 6 is a sectional view for showing the structure of a conventional probe card used in the wafer burn-in.

DETAILED DESCRIPTION OF THE INVENTION

EMBODIMENT 1

A probe card according to a first embodiment of the invention and a test method for semiconductor integrated circuits using the probe card will now be described with reference to FIGS. 1(a) and 1(b).

Figure 1A:
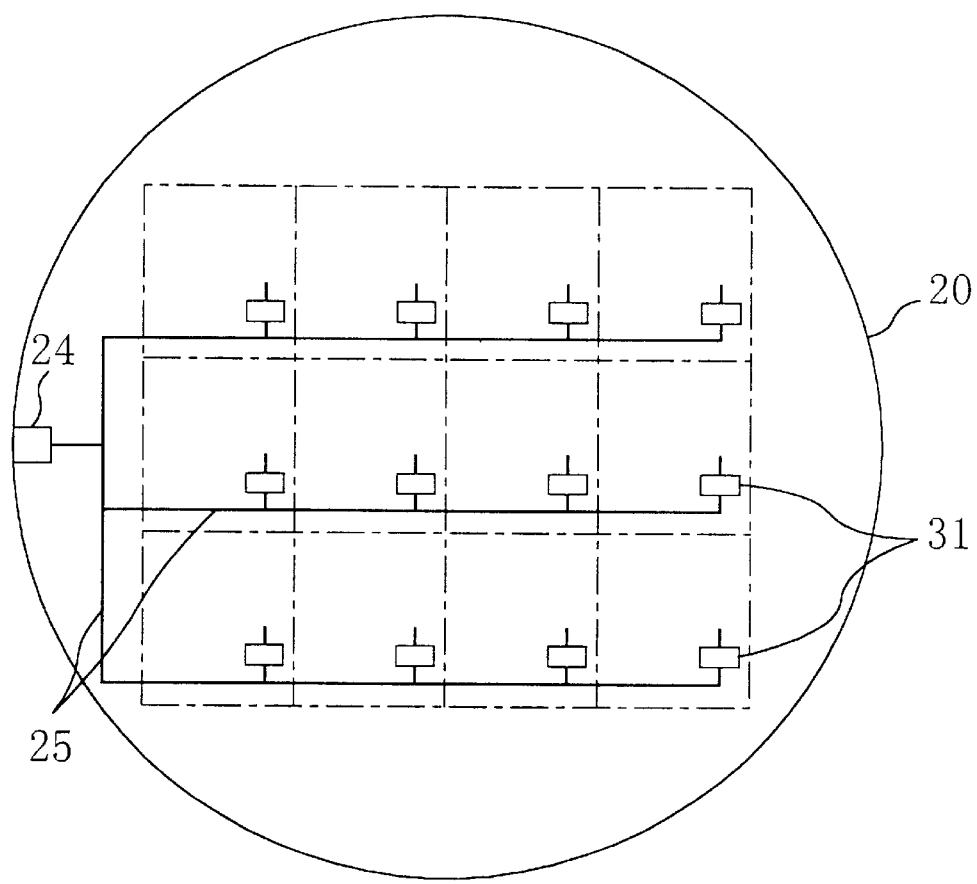
FIGS. 1(a) and 1(b) are a plan view and a sectional view for showing the structure of a probe card according to a first embodiment of the invention.
Figure 1B:
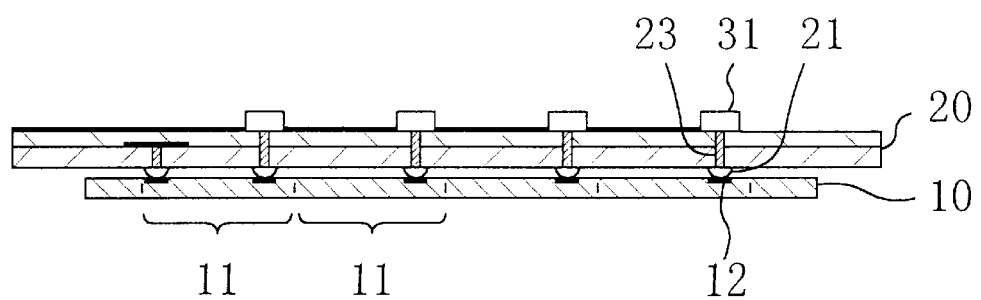

FIG. 1(a) shows the plan structure of the probe card on a surface (a back surface) other than a surface (a front surface) opposing a semiconductor wafer, and FIG. 1(b) shows the sectional structure thereof. As is shown in FIG. 1(b), plural semiconductor chips 11 are formed on the semiconductor wafer 10, and each semiconductor chip 11 includes a testing electrode 12. Each semiconductor chip 11 generally includes plural testing electrodes 12, but each semiconductor chip 11 is shown to include merely one testing electrode 12 in FIG. 1(b) for sake of convenience. Also, dashed lines are used in FIG. 1(a) to illustrate areas of the respective semiconductor chips 11.

A card body 20 included in the probe card shown in FIGS. 1(a) and 1(b) has a multilayer wiring structure formed by alternately stacking an insulating layer of a ceramic thin film and a wiring layer of a conductive film of copper or the like.

As is shown in FIGS. 1(a) and 1(b), on the front surface of the card body 20, probe terminals 21 are formed so as to correspond to the respective testing electrodes 12 of the semiconductor chips 11, and driver circuit devices 31 are disposed on the back surface of the card body 20 in positions respectively corresponding to the probe terminals 21. Furthermore, contacts 23 penetrating the card body 20 in the thickness direction are formed in the positions respectively corresponding to the probe terminals 21, so that a portion of each contact 23 on the front surface can be connected with the corresponding probe terminal 21 and a portion thereof on the back surface can be connected with the corresponding driver circuit device 31.

As is shown in FIG. 1(a), in the periphery of the back surface of the card body 20, an external electrode 24 supplied with a voltage from an external apparatus is formed. On the back surface of the card body 20, a common voltage supply line 25 is branched and extended so as to connect the external electrode 24 with the respective driver circuit devices 31. As a result, when a voltage is applied to the external electrode 24, the applied voltage is supplied through the common voltage supply line 25, the driver circuit devices 31 and the contacts 23 to the respective probe terminals 21. The common voltage supply line 25 can be a supply voltage line for applying a supply voltage or a ground voltage line for applying a ground voltage.

In this manner, in the probe card of this embodiment, the driver circuit device 31 for driving each semiconductor chip 11 is disposed in the vicinity of the corresponding semiconductor chip 11, and therefore, a control signal and the like output by the driver circuit device 31 can be prevented from being degraded. As a result, a high speed operation test can be performed on the semiconductor chips 11 without fail. In addition, the back surface of the card body 20 with a spare space can be effectively used for testing the semiconductor wafer 10 in a batch.

Each semiconductor chip 11 is provided with the driver circuit device 31 in this embodiment, but the semiconductor chips 11 formed on the semiconductor wafer can be divided into blocks applicable to optimization in consideration of the number of the semiconductor chips 11, so as to provide the driver circuit device 31 to each block.

Furthermore, the driver circuit device 31 for driving each semiconductor chip 11 can be replaced with a testing function circuit having a function to test the semiconductor chip 11, such as a built in self test (BIST) circuit and a pattern generator. In this case, similarly to the case adopting the driver circuit device 31, the signal degradation can be prevented and the load on the circuit testing apparatus can be dispersed.

Alternatively, the driver circuit device 31 for driving each semiconductor chip 11 can be replaced with a phase locked loop (PLL) circuit device serving as a frequency multiplying circuit. A PLL circuit device generates an internal clock frequency higher than an external clock frequency on the basis of the external clock frequency output by the circuit testing apparatus. For example, the PLL circuit device receives an external clock frequency of 12.5 MHZ and generates an internal clock frequency of 100 MHZ to be supplied to the semiconductor chip 11. In this manner, the function of the circuit testing apparatus can be easily improved, the signal degradation can be prevented and the load on the circuit testing apparatus can be dispersed.

EMBODIMENT 2

A probe card according to a second embodiment of the invention and a test method for semiconductor integrated circuits using the probe card will now be described with reference to FIG. 2.

In the probe card of this embodiment, an active device serving as control means mounted on the back surface of a card body 20 is provided on the output side, so as to disperse the load on the circuit testing apparatus and simplify the test.

Figure 2:
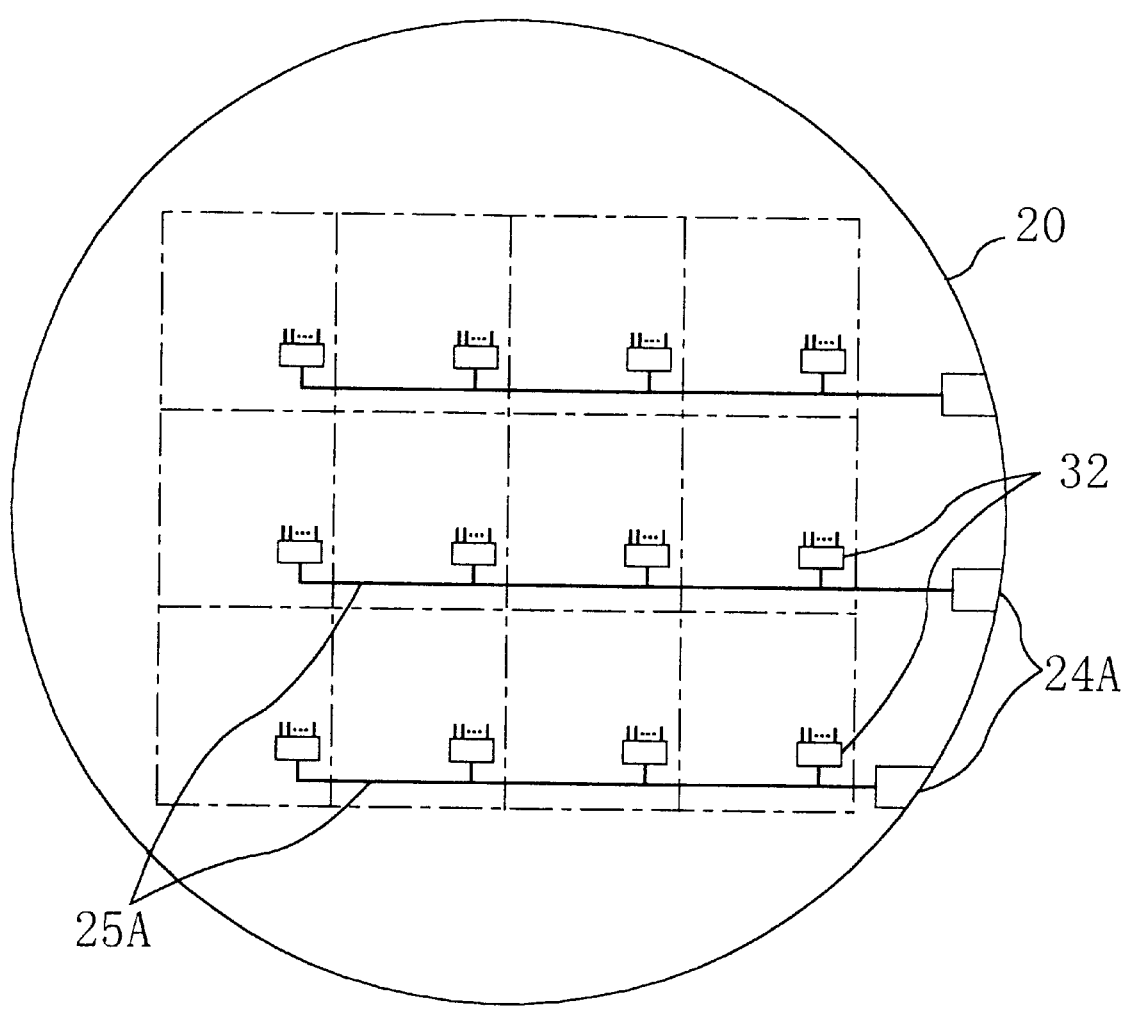
FIG. 2 is a sectional view for showing the structure of a probe card according to a second embodiment of the invention.

FIG. 2 shows the plan structure of the probe card on its back surface. In FIG. 2, like reference numerals are used to refer to like elements shown in FIG. 1(a), and the description is omitted. On the front surface of the card body 20, the probe terminals (not shown) are formed so as to correspond to respective output pads of the semiconductor chips 11, and as is shown in FIG. 2, signal compressing circuit devices 32 are disposed on the back surface of the card body 20 in positions corresponding to the probe terminals. Also, contacts (not shown) penetrating the card body 20 in the thickness direction are formed in the positions corresponding to the probe terminals, so that a portion of each contact on the front surface can be connected with the corresponding probe terminal and a portion thereof on the back surface can be connected with the corresponding signal compressing circuit device 32.

As is shown in FIG. 2, in the periphery of the back surface of the card body 20, external data output terminals 24A for outputting a test result to an external apparatus are formed. On the back surface of the card body 20, data output lines 25A for connecting the external data output terminals 24A with the respective signal compressing circuit devices 32 are formed so as to extend along respective rows of the semiconductor chips 11 formed in an array of rows and columns. As a result, when each semiconductor chip 11 outputs, for example, 32-bit data to the corresponding signal compressing circuit device 32 through the probe terminal and the contact, each signal compressing circuit device 32 calculates, for example, a logical sum of all bits of the 32-bit data and outputs the calculation result to the data output line 25A.

In this manner, in the probe card of this embodiment, each semiconductor chip 11 is provided with the signal compressing circuit device 32 for compressing multibit data output from the semiconductor chip 11 in the vicinity of the semiconductor chip 11. Accordingly, the load on the circuit testing apparatus receiving the output data can be decreased. Furthermore, the back surface of the card body 20 with a spare space can be effectively used for testing the semiconductor wafer 10 in a batch.

EMBODIMENT 3

A probe card according to a third embodiment of the invention and a test method for semiconductor integrated circuits using the probe card will now be described with reference to FIGS. 3(a) and 3(b).

In the probe card of this embodiment, a passive device is used instead of the aforementioned active device serving as the control means mounted on the back surface of the card body 20, thereby suppressing the variation of a control signal.

Figure 3A:
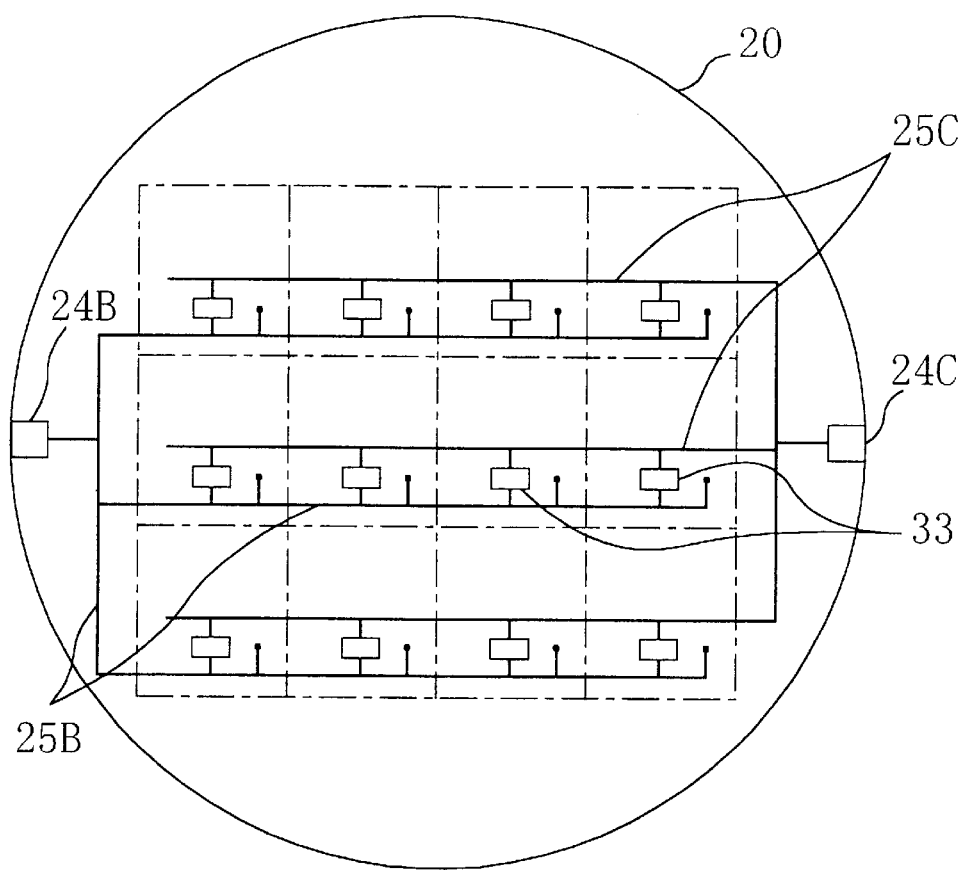
FIGS. 3(a) and 3(b) are a plan view and a sectional view for showing the structure of a probe card according to a third embodiment of the invention.
Figure 3B:
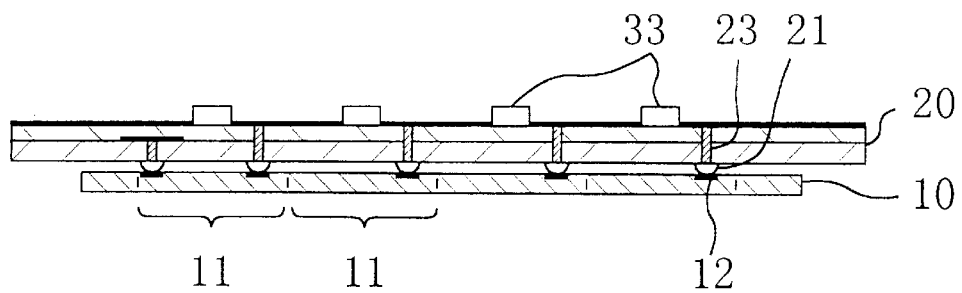

FIG. 3(a) shows the plan structure of the probe card on its back surface, and FIG. 3(b) shows the sectional structure of the probe card. In FIGS. 3(a) and 3(b), like reference numerals are used to refer to like elements shown in FIGS. 1(a) and 1(b), and the description is omitted. As is shown in FIGS. 3(a) and 3(b), on the front surface of the card body 20, the probe terminals 21 are formed correspondingly to the testing electrodes 12 of the respective semiconductor chips 11. At one end in the periphery of the back surface of the card body 20, an external supply electrode 24B supplied with a supply voltage from an external apparatus is formed. A common supply voltage line 25B is branched and extended on the back surface of the card body 20 so as to connect the external supply electrode 24B with the respective probe terminals 21.

At the other end in the periphery of the back surface of the card body 20, an external ground electrode 24C supplied with a ground voltage from an external apparatus is formed. A common ground voltage line 25C is branched and extended on the back surface of the card body 20 so as to connect the external ground electrode 24C with the respective probe terminals 21.

The card body 20 is provided with contacts 23 electrically connected with the supply voltage line 25B in positions corresponding to the probe terminals 21 so as to penetrate the card body 20 in the thickness direction. Furthermore, chip capacitors 33 serving as capacitance devices connected with the supply voltage line 25B and the ground voltage line 25C in parallel are disposed on the back surface of the card body 20 in the vicinity of the positions corresponding to the probe terminals.

As a result, when voltages are applied to the external supply electrode 24B and the external ground electrode 24C, the supplied voltages are applied through the common supply voltage line 25B and the contacts 23 to the respective probe terminals 21. At this point, even when transient voltage variation is caused between the external supply electrode 24B and the external ground electrode 24C, the chip capacitors 33 connected in parallel between the supply voltage line 25B and the ground voltage line 25C in the vicinity of the probe terminals 21 absorb the voltage variation, so that the voltages applied to the respective probe terminals 21 can be definitely stabilized.

In this manner, in the probe card of this embodiment, the supply voltage can be stabilized in each semiconductor chip 11, and the back surface of the card body 20 with a spare space can be effectively used for testing the semiconductor wafer 10 in a batch.

Each semiconductor chip 11 is provided with the chip capacitor 33 in this embodiment, but the semiconductor chips 11 can be divided into blocks suitable to the stabilization of the supply voltage, so as to provide the chip capacitor 33 to each block.

EMBODIMENT 4

A probe card according to a fourth embodiment of the invention and a test method for semiconductor integrated circuits using the probe card will now be described with reference to FIGS. 4(a) and 4(b).

Also in this embodiment, a passive device is used as the control means.

Figure 4A:
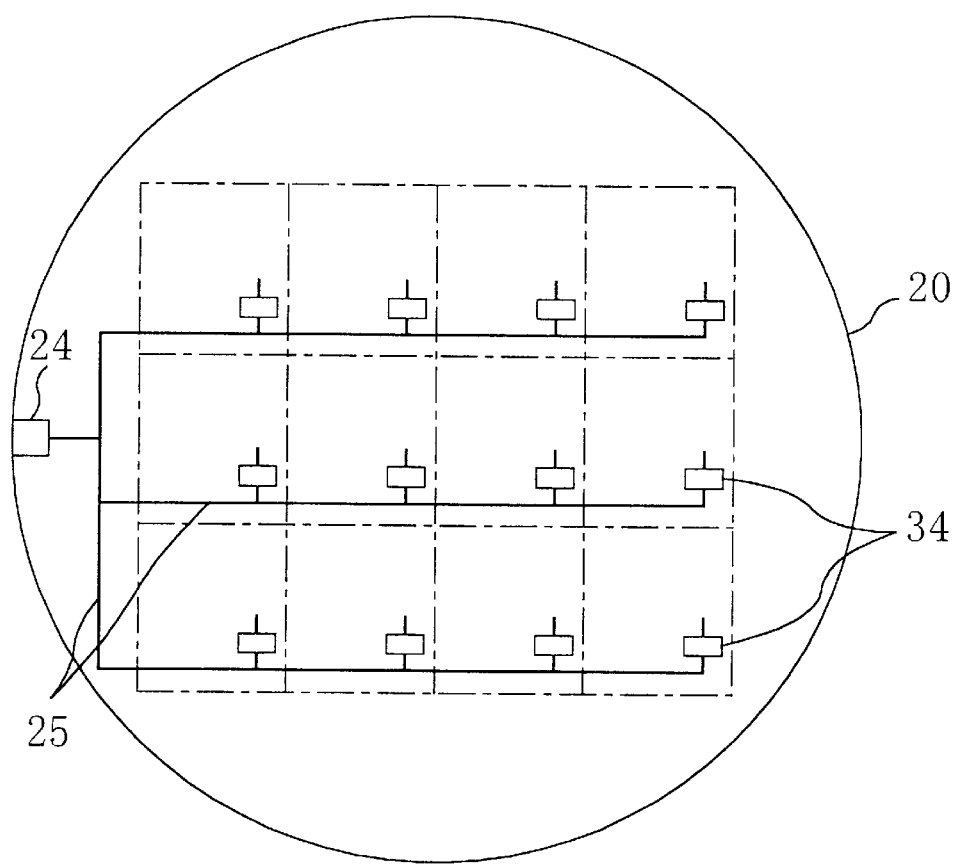
FIGS. 4(a) and 4(b) are a plan view and a sectional view for showing the structure of a probe card according to a fourth embodiment of the invention.
Figure 4B:
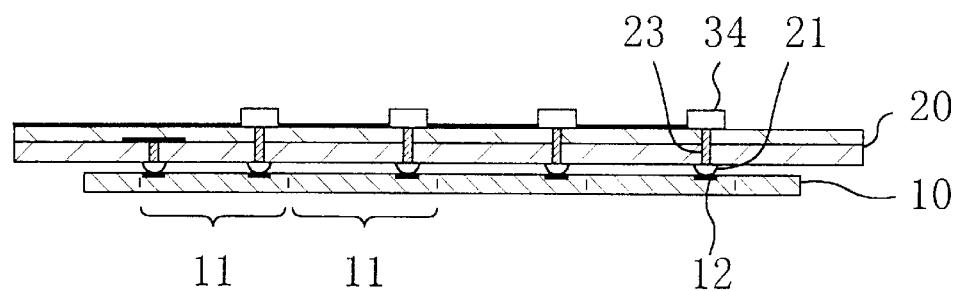
Figure 5:
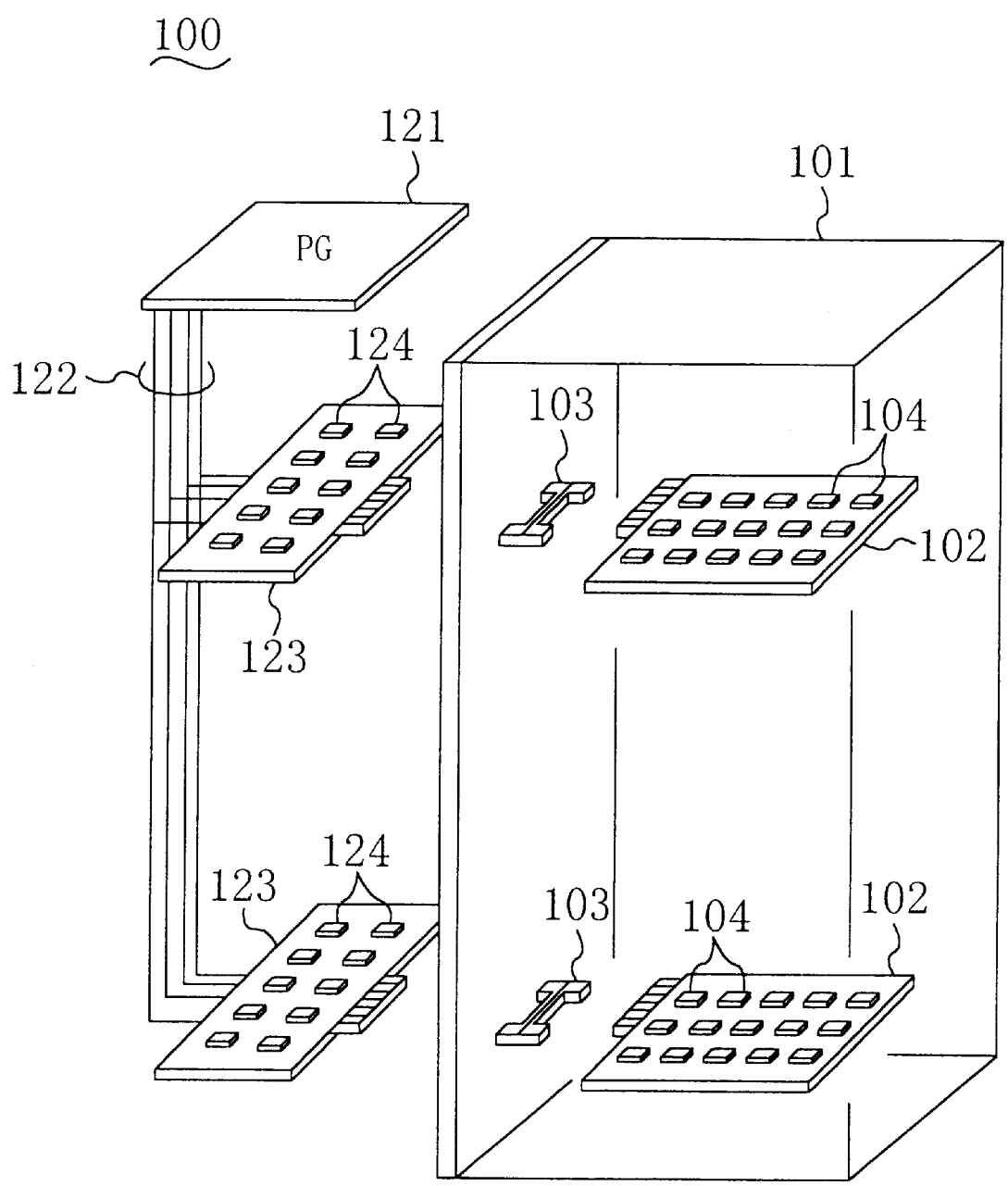
FIG. 5 is a schematic perspective view of a conventional burn-in apparatus for resin sealed semiconductor chips.
Figure 6:
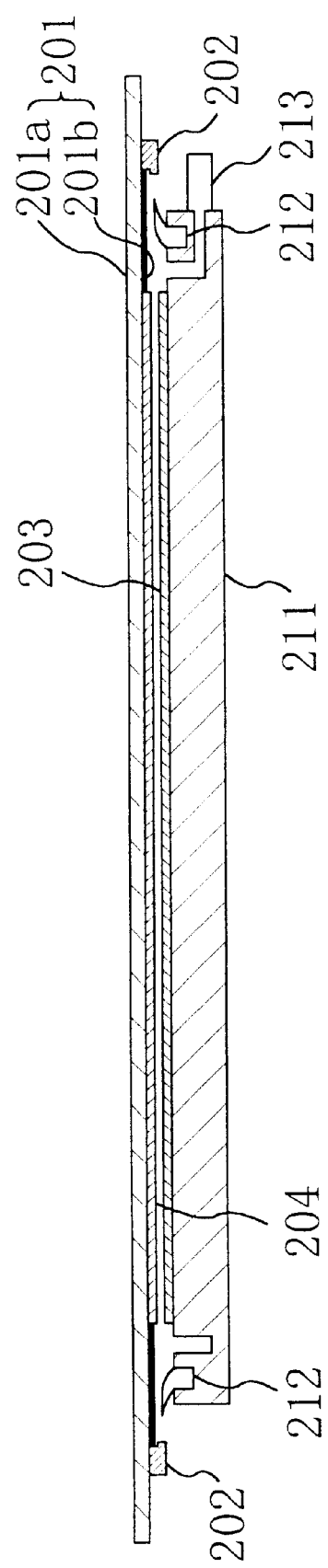

FIG. 4(a) shows the plan structure of the probe card on its back surface, and FIG. 4(b) shows the sectional structure of the probe card. In FIGS. 4(a) and 4(b), like reference numerals are used to refer to like elements shown in FIGS. 1(a) and 1(b), and the description is omitted.

On the front surface of the card body 20, the probe terminals 21 are formed correspondingly to the testing electrodes 12 of the respective semiconductor chips 11, and on the back surface of the card body 20, positive temperature coefficient (PTC) devices 34 serving as current limiting devices are disposed in the positions corresponding to the respective probe terminals 21. Also, the card body 20 is provided with the contacts 23 in the positions respectively corresponding to the probe terminals 21 so as to penetrate the card body 20, so that a portion of each contact 23 on the front surface can be connected with the corresponding probe terminal 21 and a portion thereof on the back surface can be connected with the corresponding PTC device 34.

In the periphery of the back surface of the card body 20, the external electrode 24 supplied with a voltage from an external apparatus is formed, and the common voltage supply line 25 is branched and extended on the back surface of the card body 20 so as to connect the external electrode 24 with the respective PTC devices 34. As a result, when a voltage is applied to the external electrode 24, the applied voltage is applied through the common voltage supply line 25, the PTC devices 34 and the contacts 23 to the respective probe terminals 21. The common voltage supply line 25 can be a supply voltage line for applying a supply voltage or a ground voltage line for applying a ground voltage.

As the PTC device 34, a polymer PTC device or a ceramic PTC device of barium titanate ($BaTiO_3$) or the like can be used.

A polymer PTC device is a resistance device obtained by combining carbon with a conducting property and a polymer with an insulating property, such as polyolefine and a fluororesin, and has a low specific resistance value in a normal state because carbon dispersed in the polymer forms a large number of conductive paths therein. However, when the temperature is gradually increased from the normal state, the conductive paths of carbon are gradually cut because the polymer has a larger coefficient of thermal expansion than carbon, resulting in the polymer PTC device exhibiting a gentle PTC characteristic. When the temperature exceeds a predetermined temperature (which can be desirably selected by changing the proportion between the conductive carbon and the insulating polymer or selecting the kind of the insulating polymer), the PTC effect is abruptly exhibited. Specifically, since the conductive paths of carbon are successively cut due to the variation of the polymer in its volume by several tens % derived from the fusion of the polymer, the resistance value is increased by several figures, for example, by approximately five figures.

In a ceramic PTC device, the predetermined temperature at which the PTC effect is exhibited can be selected by adjusting the amount of an impurity to be added. For example, in a ceramic PTC device of barium titanate, the predetermined temperature at which the PTC effect is exhibited can be increased by adding Pb as an impurity, and the temperature can be more increased as the amount of Pb is larger.

In general, a phenomenon where the resistance value of a PTC device is remarkably increased as compared with that attained in the normal state due to a large current flowing therethrough or due to increase of the temperature thereof is designated as a trip. The resistance of a PTC device is stable at a very small value against a load in the normal state. However, when the amount of the flowing current exceeds a reference value (a trip current) depending upon the characteristic of the PTC device, the resistance of the PTC device is increased due to self-heat generation, resulting in limiting the current flowing through the PTC device to be very small. When the PTC device is once placed in a trip state, the PTC device is stabilized with retaining its high resistance, and hence remains to be in the trip state. When the temperature of the PTC device is returned to the initial value because the power supply is stopped or when the voltage in the circuit is sufficiently decreased (i.e., the amount of the generated heat becomes smaller than the amount of released heat in the PTC device), the PTC device automatically returns to the normal state.

Now, the test method for semiconductor devices using the probe card of the fourth embodiment will be described.

First, with the testing electrodes 12 of the plural semiconductor chips 11 on the semiconductor wafer 10 connected with the respective probe terminals 21 of the probe card, a supply voltage or a ground voltage is applied to the external electrode 24 of the probe card. At this point, in the case where the substrate of the semiconductor chips 11 is connected with a ground voltage, a supply voltage is applied to the external electrode 24, and in the case where the substrate of the semiconductor chips 11 is connected with a supply voltage, a ground voltage is applied to the external electrode 24. The voltage applied to the external electrode 24 is applied through the common voltage supply line 25, the PTC devices 34, the contacts 23 and the probe terminals 21 to the respective testing electrodes 12.

Next, under application of the voltage to the testing electrodes 12, the semiconductor wafer 10 and the probe card are retained at a predetermined temperature for the burn-in. When an abnormally large current flows in any of the semiconductor chips 11 because of a defect inherent to or caused during the batch test in the semiconductor chip 11, the large current also flows to the PTC device 34 connected with the defective semiconductor chip 11. Therefore, the temperature of the PTC device 34 through which the large current flows is increased, resulting in largely increasing the resistance thereof. As a result, no voltage can be applied to the defective semiconductor chip 11.

Accordingly, the temperature increase in the defective semiconductor chip 11 is avoided. Therefore, it is possible to avoid a situation where the temperature of another semiconductor chip 11 adjacent to the defective semiconductor chip 11 is abnormally increased so that the burn-in cannot be normally performed. In addition, it is possible to avoid a situation where the supply voltage line and the ground voltage line are short-circuited through the defective semiconductor chip 11 so that no voltage can be applied to the other good semiconductor chips 11.

Furthermore, in the fourth embodiment, since the plural probe terminals 21 are disposed on the front surface of the card body 20 and the common voltage supply line 25 is disposed on the back surface of the card body 20, there remains a spare space on the back surface of the card body 20. As a result, the PTC devices 34 can be formed on the back surface of the card body 20 correspondingly to the respective semiconductor chips 11.

In each of the aforementioned embodiments of the invention, a rigid substrate obtained by alternately stacking an insulating layer of ceramic and a wiring layer of a conductive film is used as the card body 20 of the probe card, which does not limit the invention. Instead, a glass substrate having, on its main surface, a multilayer wiring structure formed by alternately stacking an insulating layer of polyimide or the like and a wiring layer of a conductive film can be used.

Moreover, the test for semiconductor devices using the probe card according to any of the embodiments of the invention is not limited to the burn-in at the wafer level but can be any of general tests for their electric characteristics.

What is claimed is:

1. A probe card for use in simultaneous testing an electrical characteristic of plural semiconductor chips formed on a semiconductor wafer in a batch at a wafer level by applying a voltage to electrodes of said plural semiconductor chips, comprising:

a card body;

plural probe terminals disposed on a first surface of said card body in positions respectively corresponding to each of said electrodes of said semiconductor chips;

a wiring disposed on a second surface of said card body;

plural control means disposed on the second surface of said card body; and plural contacts penetrating said first surface and said second surface, and are included in said card body, wherein said wiring is electrically connected to each said probe terminals via said plural control means and contacts.

2. The probe card of claim 1, wherein said wiring is a voltage supply line for supplying a voltage to said probe terminals via through holes formed in said card body and said control means includes a driver circuit device.

3. The probe card of claim 1, wherein said wiring is a voltage supply line for supplying a voltage to said probe terminals via through holes formed in said card body and said control means includes a testing function circuit device.

4. The probe card of claim 1, wherein said wiring is a voltage supply line for supplying a voltage to said probe terminals via through holes formed in said card body and said control means includes a frequency multiplying circuit device.

5. The probe card of claim 1, wherein said wiring is a data output line for receiving output from said probe terminals via through holes formed in said card body and said controls means includes a signal compressing circuit device.

6. The probe card of claim 1, wherein said control means includes a capacitance device disposed in paralell to said wiring.

7. The probe card of claim 1, wherein said wiring is a voltage supply line for supplying a voltage to said probe terminals via through holes formed in said card body and said control means includes a current limiting device.

* * * * *

UNITED STATES PATENT AND TRADEMARK OFFICE
CERTIFICATE OF CORRECTION

PATENT NO. : 6,518,779 B1
DATED : February 11, 2003
INVENTOR(S) : Yoshiro Nakata et al.

It is certified that error appears in the above-identified patent and that said Letters Patent is hereby corrected as shown below:

Title page,
Item [73], Assignee, delete "Matsushita Electric Industrial Do., Ltd." and replace with -- Matsushita Electric Industrial Co., Ltd. --
Item [56], References Cited, FOREIGN PATENT DOCUMENTS,
delete "JP 63-146770 9/1998" and replace with -- JP 63-146770 9/1988 --

Column 10,
Line 51, please replace "paralell" to -- parallel --

Signed and Sealed this

Thirteenth Day of April, 2004

JON W. DUDAS
*Acting Director of the United States Patent and Trademark Office*